United States Patent
Eda et al.

(10) Patent No.: US 8,114,776 B2
(45) Date of Patent: Feb. 14, 2012

(54) METHOD OF MANUFACTURING SEMICONDUCTOR DEVICE

(75) Inventors: Hajime Eda, Kanagawa (JP); Yukiteru Matsui, Kanagawa (JP); Atsushi Shigeta, Mie (JP); Takatoshi Ono, Oita (JP); Satoko Seta, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/781,393

(22) Filed: May 17, 2010

(65) Prior Publication Data

US 2011/0076833 A1    Mar. 31, 2011

(30) Foreign Application Priority Data

Sep. 25, 2009    (JP) .................................. 2009-220901

(51) Int. Cl.
*H01L 21/302* (2006.01)
(52) U.S. Cl. ...................................................... 438/692
(58) Field of Classification Search ........................ None
See application file for complete search history.

(56) References Cited

U.S. PATENT DOCUMENTS

| | | | | |
|---|---|---|---|---|
| 5,958,794 | A * | 9/1999 | Bruxvoort et al. | 438/692 |
| 6,716,087 | B2 * | 4/2004 | Miyashita et al. | 451/41 |
| 6,749,714 | B1 * | 6/2004 | Ishikawa et al. | 156/345.12 |
| 2004/0224616 | A1 * | 11/2004 | Shiho et al. | 451/41 |
| 2004/0229394 | A1 * | 11/2004 | Yamada et al. | 438/66 |
| 2007/0072112 | A1 * | 3/2007 | Prokopowicz et al. | 430/270.1 |

FOREIGN PATENT DOCUMENTS

| | | |
|---|---|---|
| JP | 2007-157841 | 6/2007 |
| JP | 4050011 | 12/2007 |
| JP | 2008-187191 | 8/2008 |
| JP | 2008-226935 | 9/2008 |
| JP | 2009-4727 | 1/2009 |

* cited by examiner

*Primary Examiner* — Charles Garber
*Assistant Examiner* — Andre' C Stevenson
(74) *Attorney, Agent, or Firm* — Finnegan, Henderson, Farabow, Garrett & Dunner, L.L.P.

(57) ABSTRACT

In a method of manufacturing a semiconductor device for planarizing a silicon oxide film with chemical mechanical polishing using a silicon film formed on a semiconductor substrate as a stopper film, a surface modification film for hydrophilizing the surface of the silicon film is formed on an upper layer of the polysilicon film, and slurry for the chemical mechanical polishing contains cerium oxide particles, a surface active agent, and resin particles having a cationic or anionic functional group.

21 Claims, 4 Drawing Sheets

- ⬡(+) CERIA ABRASIVE GRAIN
- ⊖ ANIONIC RESIN PARTICLES
- ⊕ CATIONIC RESIN PARTICLES

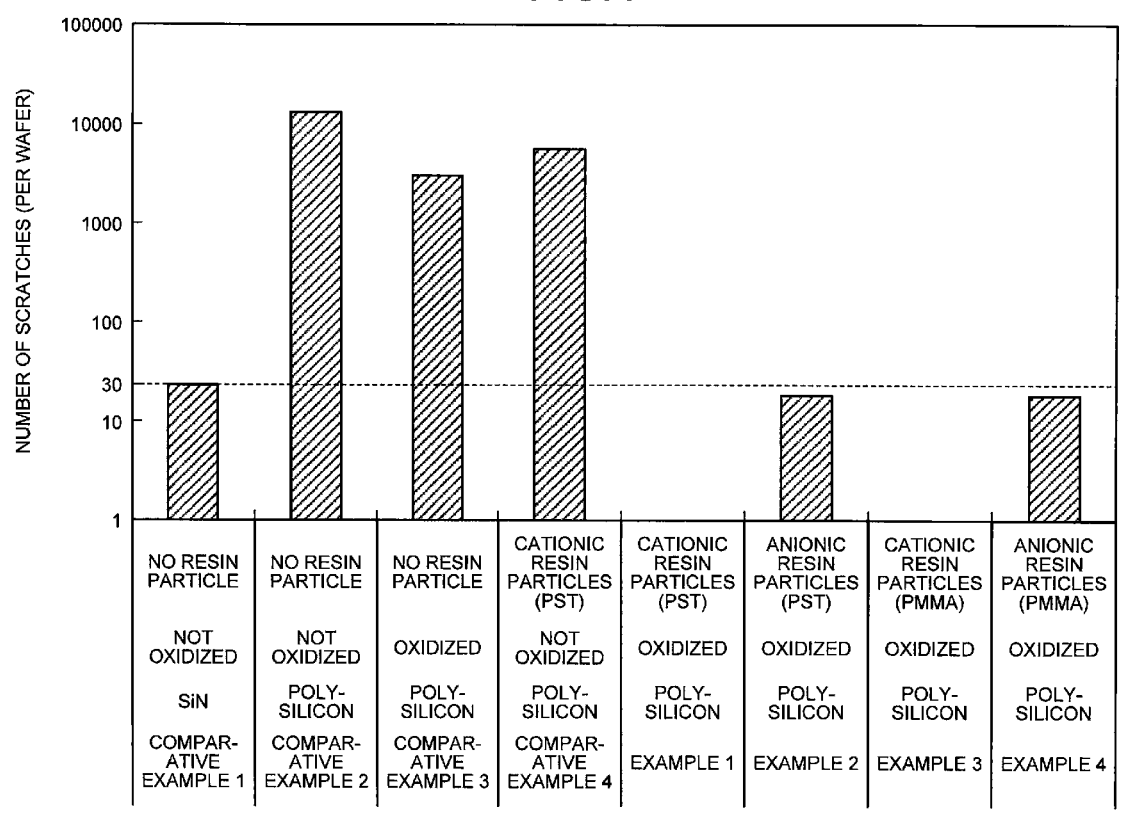

METHOD OF MANUFACTURING SEMICONDUCTOR DEVICE

CROSS-REFERENCE TO RELATED APPLICATIONS

This application is based upon and claims the benefit of priority from the prior Japanese Patent Application No. 2009-220901, filed on Sep. 25, 2009; the entire contents of which are incorporated herein by reference.

BACKGROUND OF THE INVENTION

1. Field of the Invention

The present invention relates to a method of manufacturing a semiconductor device, and, more particularly is suitably applied to a method of polishing a silicon oxide film using a silicon film as a stopper film in a chemical mechanical polishing (CMP) process.

2. Description of the Related Art

In a multilayer wiring process and a formation process for device isolation, a chemical mechanical polishing (CMP) method is often used as a process for planarizing a surface. In a device isolation structure, a stopper film is used to automatically detect timing for ending polishing. A silicon nitride film is often used as a material of the stopper film from a viewpoint of detection performance and a surface state after polishing.

For example, Japanese Patent Application Laid-Open No. 2008-226935 discloses a method of using a polysilicon film of a base as a stopper film without using a silicon nitride film.

However, in the method of using the silicon nitride film as the stopper film, because it is necessary to remove the silicon nitride film after a CMP process, the number of processes increases.

In the method disclosed in Japanese Patent Application Laid-Open No. 2008-226935, the surface of the polysilicon film is frequently rubbed by abrasive particles, scratches on the surface of the polysilicon film increase. When a device is manufactured by using the polysilicon film, deterioration in device performance is anticipated.

BRIEF SUMMARY OF THE INVENTION

A method of manufacturing a semiconductor device for planarizing a silicon oxide film with chemical mechanical polishing using, as a stopper film, a silicon film formed on a semiconductor substrate is characterized in that a surface modification film for hydrophilizing a surface of the silicon film is formed on an upper layer of the polysilicon film, and slurry for the chemical mechanical polishing contains cerium oxide particles, a surface active agent, and resin particles having a cationic or anionic functional group.

A method of manufacturing a semiconductor device according to an embodiment of the present invention comprises: forming a first silicon oxide film on a semiconductor substrate; forming a polysilicon film on the first silicon oxide film; forming a surface modification film for hydrophilizing a surface of the polysilicon film; forming device isolation grooves in the semiconductor substrate through the polysilicon film and the first silicon oxide film; depositing a second silicon oxide film over an entire surface of the semiconductor substrate to fill the device isolation grooves; and planarizing the second silicon oxide film by performing, using the polysilicon film as a stopper film, chemical mechanical polishing of the second silicon oxide film using slurry containing cerium oxide particles, a surface active agent, and resin particles having a cationic or anionic functional group.

BRIEF DESCRIPTION OF THE DRAWINGS

FIG. 4 is a diagram of the numbers of scratches on a polysilicon film according to examples of the present invention and the numbers of scratches on a polysilicon film in comparative examples.

DETAILED DESCRIPTION OF THE INVENTION

Exemplary embodiments of the present invention are explained in detail below with reference to the accompanying drawings. The present invention is not limited by the embodiments.

Figure 1:
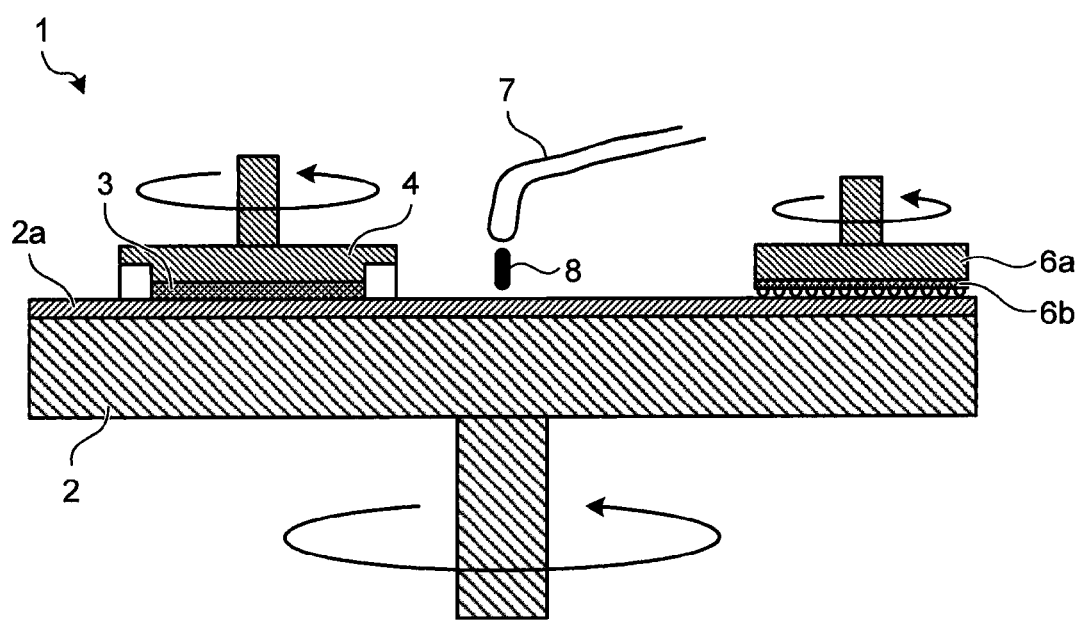
FIG. 1 is a sectional view of the schematic configuration of a polishing device used in a CMP process according to an embodiment of the present invention.

FIG. 1 is a sectional view of the schematic configuration of a polishing device used in a CMP process according to an embodiment of the present invention.

In FIG. 1, a polishing device 1 includes a polishing table 2 on which a wafer 3 is placed, a polishing head 4 that presses the wafer 3 on the polishing table 2, and a nozzle 7 that supplies slurry 8 onto the polishing table 2. A semiconductor substrate can be used as the wafer 3. A silicon oxide film as a polishing object and a polysilicon film as a stopper film can be formed on the semiconductor substrate. A surface modification film for hydrophilizing the surface of the polysilicon film is formed on an upper layer of the polysilicon film. As the surface modification film, for example, a silicon oxide film formed by oxidation treatment or anneal treatment of the upper layer of the polysilicon film can be used.

The slurry 8 contains cerium oxide particles, a surface active agent, and resin particles having a cationic or anionic functional group. As the surface active agent, for example, polycarbonic acid such as polyacrylic acid ammonium or a salt thereof can be used. At low concentration, the surface active agent deteriorates dispersability of the cerium oxide particles. At high concentration, the surface active agent adheres to the cerium oxide particles and suppresses a polishing rate. Therefore, the concentration of the surface active agent is desirably set in a range of 0.001 percent by mass to 0.3 percent by mass. As the resin particles, for example, polystyrene (PST) resin particles or polymethyl methacrylate (PMMA) resin particles can be used. At low concentration, a protective effect of the resin particles is not sufficiently obtained. At high concentration, the resin particles suppress the polishing rate more than necessary. Therefore, the concentration of the resin particles is desirably set in a range of 0.01 percent by mass to 10 percent by mass. A particle diameter of the resin particles is desirably set in a range of 50 angstroms to 10000 angstroms.

The functional group can be selected from a carbonic acid functional group, a sulfonic acid functional group, a sulfate ester functional group, a phosphate ester functional group, an amine salt functional group, a quaternary ammonium salt functional group, an ether functional group, an ester functional group, an alkanol amide functional group, a carboxy betaine functional group, and a glycin functional group. Preferably, the amine salt functional group can be used as the cationic functional group and a carbonic salt functional group or a sulfonic salt functional group can be used as the anionic functional group. At low concentration, the cerium oxide particles in the slurry 8 have a low polishing rate. At high concentration, the cerium oxide particles have an excessive rate and there is concern about an increase in scratches. Therefore, the concentration of the cerium oxide particles in the slurry 8 is desirably set within a range of 0.1 percent by mass to 10 percent by mass. At a low flow rate of the slurry 8, there is concern about deterioration in the polishing rate and evenness. At a high flow rate of the slurry 8, there is concern about an increase in consumption. Therefore, the flow rate of the slurry 8 is desirably set within a range of 80 ml/min to 400 ml/min.

A polishing pad 2a is arranged on the polishing table 2. A dresser 6b for dressing the polishing pad 2a is arranged on the polishing pad 2a. The dresser 6b can be pressed on the polishing pad 2a by a dresser head 6a. Polyurethane can be used as a material of the polishing pad 2a. An interaction with the resin particles can be expected irrespectively of an elastic modulus and a groove pattern. When the elastic modulus and the cut rate of the polishing pad 2a are taken into account, a yarn count of the dresser 6b is desirably set within a range of #80 to #300.

At low load and low rotation speed, the polishing rate is low and, moreover, end point detection is difficult. At high load and high rotation speed, there is concern about deterioration in evenness and an increase in scratches. Therefore, polishing load is desirably set in a range of 150 hectopascals to 500 hectopascals and the number of table revolutions and the number of wafer revolutions are desirably set within a range of 60 revolutions per minute to 110 revolutions per minute.

When the silicon oxide film on the wafer 3 is planarized, the wafer 3 is arranged on the polishing table 2. In a state in which the surface of the wafer 3 is pressed on the polishing pad 2a by the polishing head 4, the polishing table 2 and the polishing head 4 are rotated while the slurry 8 is supplied onto the polishing pad 2a via the nozzle 7.

The silicon oxide film is thinned until the polysilicon film is exposed. When the polysilicon film is exposed, the polishing of the silicon oxide film is ended. The silicon oxide film can be used as an embedded insulating film such as shallow trench isolation (STI) or an interlayer insulating film. The polysilicon film can be left on the wafer 3 without being removed after the planarization of the silicon oxide film and can be used as a gate electrode or a floating gate electrode.

A hydrophilic surface modification film is formed on an upper layer of the polysilicon film and cerium oxide particles, a surface active agent, and resin particles having a cationic or anionic functional group are contained in the slurry 8. This makes it possible to protect the surface of the polysilicon film with the resin particles via the surface modification film and obtain a buffer effect by the resin particles. Therefore, even when hard cerium oxide particles are contained in the slurry 8, it is possible to suppress the surface of the polysilicon film from being strongly rubbed by the cerium oxide particles. Even when the polysilicon film is used as a stopper film for the CMP, it is possible to reduce scratches that occur on the surface of the polysilicon film. As a result, even when a semiconductor device is formed by using the polysilicon film, it is possible to suppress deterioration in characteristics and omit a process for forming a silicon nitride film as a stopper film. Therefore, it is possible to realize a reduction in price while suppressing deterioration in performance of a semiconductor device formed on the wafer 3.

The semiconductor device formed on the wafer 3 can be used for, for example, a memory, a system large scale integration (LSI), a high-speed logic LSI, and a hybrid memory/logic LSI.

Figure 2A:
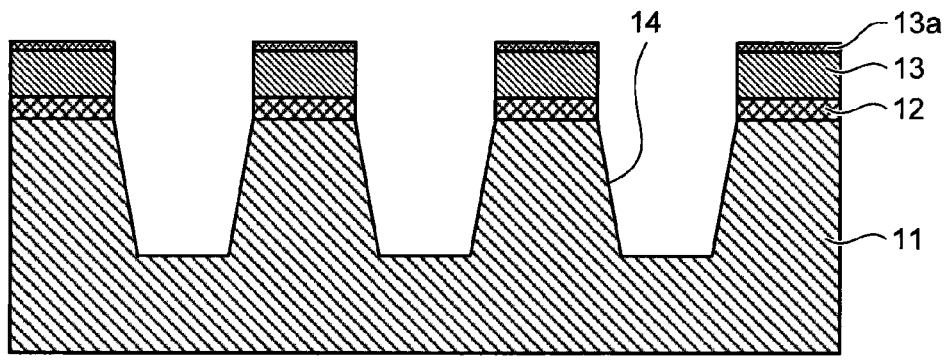
FIGS. 2A to 2C are sectional views for explaining a method of manufacturing a semiconductor device according to the embodiment.
Figure 2B:
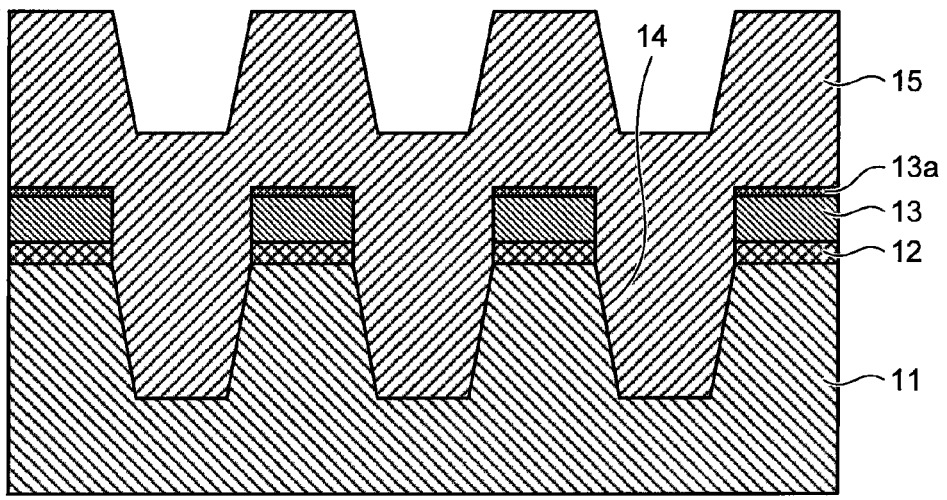
Figure 2C:
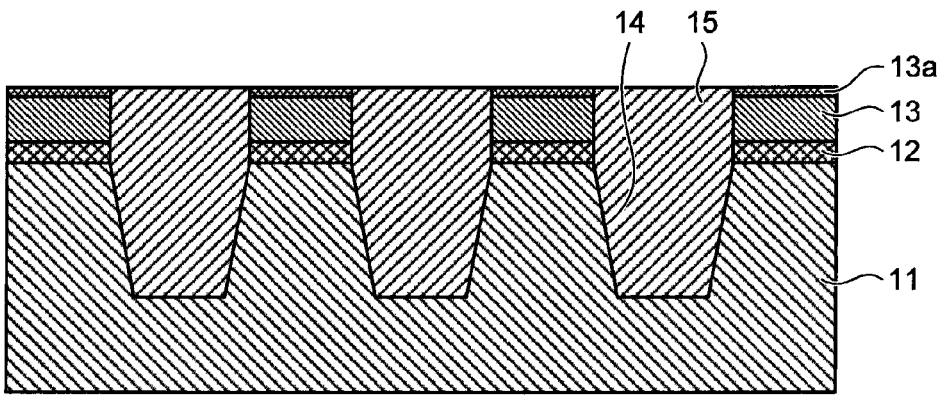

FIGS. 2A to 2C are sectional views for explaining a method of manufacturing a semiconductor device according to the embodiment.

In FIG. 2A, a silicon oxide film 12 is formed on a semiconductor substrate 11 by using a method such as chemical vapor deposition (CVD), thermal oxidation, or radical oxidation. As the semiconductor substrate 11, for example, a silicon substrate can be used. The silicon oxide film 12 can be used as, for example, a gate insulating film or a tunnel oxide film.

Subsequently, a polysilicon film 13 is formed on the silicon oxide film 12 by using a method such as CVD. A surface modification layer 13a is formed on a surface layer of the polysilicon film 13 by performing heat treatment of the surface of the polysilicon film 13 in the oxygen atmosphere. For example, the temperature of the heat treatment at this point can be set to 900° C. and the time of the heat treatment can be set to 20 seconds. As a method of forming the surface modification layer 13a on the surface layer of the polysilicon film 13, $N_2$ anneal can be used, pyro-oxidation can be used, or HCl oxidation can be used.

Device isolation grooves 14 are formed in the semiconductor substrate 11 through the polysilicon film 13 and the silicon oxide film 12 by using the photolithography technology and the dry etching technology. Timing for forming the surface modification layer 13a on the surface layer of the polysilicon film 13 can be before the formation of the device isolation grooves 14 in the semiconductor substrate 11 or can be after the formation of the device isolation grooves 14 in the semiconductor substrate 11.

As shown in FIG. 2B, a silicon oxide film 15 is deposited over the entire surface of the semiconductor substrate 11 by using a method such as CVD to fill the device isolation grooves 14.

As shown in FIG. 2C, a wafer as the semiconductor substrate 11 is placed on the polishing device 1 shown in FIG. 1. The silicon oxide film 15 is thinned until the surface of the surface modification layer 13a is exposed. A device isolation structure is formed in the semiconductor substrate 11.

After the process shown in FIG. 2C, a gate electrode or a floating gate electrode can be formed by patterning the polysilicon film 13 using the photolithography technology and the dry etching technology.

Figure 3:
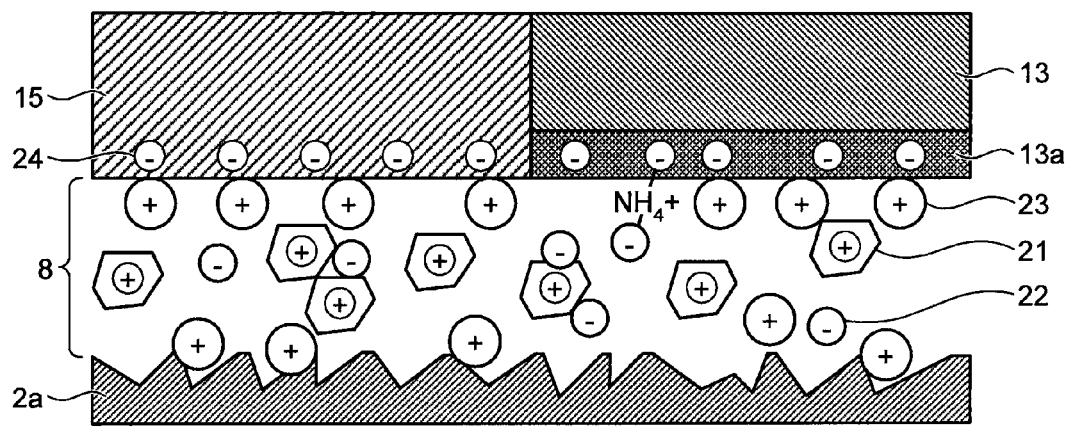
FIG. 3 is a sectional view for explaining the behavior of resin particles during polishing according to the embodiment.
Figure 3:
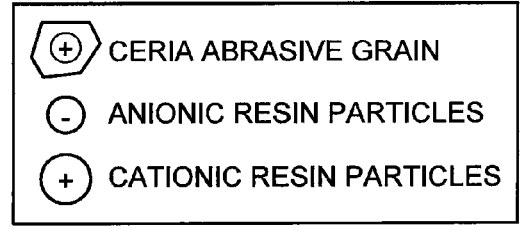

FIG. 3 is a sectional view for explaining the behavior of resin particles during polishing according to the embodiment.

In FIG. 3, ceria (ceric oxide) abrasive grains 21, anionic resin particles 22, and cationic resin particles 23 are contained in the slurry 8 shown in FIG. 1. As counter ions, for example, $NH_4^+$ is included in the surface active agent contained in the slurry 8.

The surface of the silicon oxide film 15 exhibits hydrophilicity. The polysilicon film 13 itself exhibits hydrophobicity. Therefore, the surface of the silicon oxide film 15 and the surface of the surface modification layer 13a are charged with negative charges 24. The ceria abrasive grains 21 and the cationic resin particles 23 exhibit positive polarity and the anionic resin particles 22 exhibit negative polarity.

Therefore, the cationic resin particles 23 can directly adhere to the surface of the surface modification layer 13a and protect the surface of the surface modification layer 13a. The anionic resin particles 22 can adhere to the surface of the surface modification layer 13a via $NH_4^+$ and protect the surface of the surface modification layer 13a. The anionic resin particles 22 can adhere to the surface of the ceria abrasive grains 21 and suppress the surface modification layer 13a from being directly rubbed by the ceria abrasive grains 21.

In the example shown in FIG. 3, both the anionic resin particles 22 and the cationic resin particles 23 are contained in the slurry 8. However, only one of the anionic resin particles 22 and the cationic resin particles 23 can be contained in the slurry 8. In the embodiment explained above, the method of using the polysilicon film as the stopper film is explained as the example. However, an amorphous silicon film, a continuous grain silicon film, or the like can also be used. When the stopper film is left and used as a gate electrode or a floating electrode, for example, it is possible to convert these films into a polysilicon film in heat treatment in a post process.

FIG. 4 is a diagram of the numbers of scratches on a polysilicon film according to examples of the present invention and the numbers of scratches on a polysilicon film in comparative examples. In examples 1 to 4 and comparative examples 1 to 4 shown in FIG. 4, common polishing conditions were set as follows:

polishing device 1: FREX300E (manufactured by Ebara Corporation)
polishing pad 2a: IC1000 (manufactured by Nitta Haas Incorporated)
dresser 6b: diamond dresser (manufactured by Asahi Diamond Industrial Co., Ltd.)
polishing load: 400 hPa
number of table revolutions: 60 rpm
number of wafer revolutions: 60 rpm
slurry flow rate: 190 ml/min As a base of slurry in the examples 1 to 4 and the comparative examples 1 to 4 shown in FIG. 4, slurry manufactured by Showa Denko K.K. containing 5.0 percent by mass of cerium oxide particles was used. The slurry itself manufactured by Showa Denko K.K. contains an ammonium salt of polycarbonic acid as a surface active agent.

In FIG. 4, in the example 1, the polysilicon film 13 was used as a stopper film to form the surface modification layer 13a on the surface of the polysilicon film 13. As the slurry 8, PST resin particles obtained by adding resin particles in the slurry manufactured by Showa Denko K.K. and giving a cationic functional group to the slurry as resin particles were used. In the PST resin particles, 0.1 percent by mass of R04 (manufactured by JSR Corporation) was contained. The concentration of the surface active agent was 0.1 percent by mass.

In this case, the surface of the polysilicon film 13 is negatively charged by a modification process. Therefore, the resin particles having positive charges adhere to the surface modification layer 13a and play a role of surface protection. A buffer effect due to an elastic action of the resin particles is obtained. As a result, excessive contact of the ceria abrasive grains 21 and the polysilicon film 13 shown in FIG. 3 was suppressed and the occurrence of scratches could be prevented.

The surface of the silicon oxide film 15 exhibits hydrophilicity. However, it is anticipated that an area sufficiently modified and hydrophilized and an area insufficiently modified and still having a hydrophobic characteristic are mixed on the surface of the polysilicon film 13. On the other hand, a portion having a surface functional group of the resin particles exhibits hydrophilicity and a portion not having the surface functional group exhibits hydrophobicity. Therefore, the hydrophilic group acts on the surface modification layer 13a that exhibits hydrophilicity. The hydrophobic portion acts on the hydrophobic area insufficiently modified. Therefore, the adhesion of the resin particles tends to be rigid.

In the example 2, the polysilicon film 13 was used as a stopper film and the surface modification layer 13a was formed on the surface of the polysilicon film 13. As the slurry 8, PST resin particles obtained by adding resin particles in the slurry manufactured by Showa Denko K.K. and giving an anionic functional group to the slurry as resin particles were used. In the PST resin particles, 0.1 percent by mass of RST-01 (manufactured by JSR Corporation) was contained. The concentration of the surface active agent was 0.1 percent by mass.

In this case, the resin particles adhere to the surface of the wafer 3 via counter ions such as $H^+$ and $NH_4^+$ generated from the surface active agent present in the slurry 8. Therefore, a protective effect can be obtained. Dispersion of the resin particles into the slurry 8 increases an elastic modulus and exhibits a buffer effect. Therefore, it is possible to obtain a polishing state in which scratches less easily occur. Further, the anionic resin particles 22 tend to electrically adhere to the ceria abrasive grains 21. The surface of the wafer 3 shifts to the negative side because of the surface modification of the polysilicon film 13. The ceria abrasive grains 21 also shift to the negative side because of the adhesion to the resin particles. Therefore, it is possible to suppress excessive contact with the ceria abrasive grains 21 that causes scratches.

In the examples 3 and 4, the resin material used in the examples 1 and 2 was changed from PST to PMMA. As the PMMA resin particles, in the example 3, 0.1 percent by mass of R05 (manufactured by JSR Corporation) was contained and, in the example 4, 0.1 percent by mass of R83 (manufactured by JSR Corporation) was contained. The concentration of the surface active agent was 0.1 percent by mass. In this case, an effect same as that in the examples 1 and 2 was obtained and the number of scratches could be reduced.

In the comparative example 1, as the slurry 8, slurry obtained by adding, as a surface active agent, polyacrylic acid ammonium to the slurry manufactured by Showa Denko K.K. was used. As the surface active agent, TK75 (manufactured by Kao Corporation) was used. The concentration of the surface active agent at this point was 0.5 percent by mass. A silicon nitride film having high wettability with polishing particles was used as a stopper film. In this case, because the silicon nitride film and the polishing particles were hydrophilic, not so many scratches occurred. However, the silicon nitride film used as the stopper film causes an increase in the number of processes.

In the comparative example 2, conditions were set the same as those in the comparative example 1 except that a hydrophobic polysilicon film was used as a stopper film without being subjected to surface modification. In this case, it can be surmised that, if polyacrylic acid ammonium is added to slurry, the polyacrylic acid ammonium adheres to the surface of the hydrophobic polysilicon film and plays a role of surface protection for the polysilicon film. However, the number of scratches was 4000 times or more as many as the number of scratches that occurred when the stopper film was the silicon nitride film.

In the comparative example 3, conditions are set the same as those in the comparative example 2 except that modification of the surface of a polysilicon film was performed before polishing. Wettability of the surface of the hydrophilized polysilicon film was improved by the modification of the surface of the polysilicon film and the number of scratches was reduced compared with the comparative example 2. However, the number of scratches was a value outside an allowable range in using the polysilicon film as a gate electrode.

In the comparative example 4, conditions are set the same as those in the example 1 except that modification of the surface of a polysilicon film was not performed before polishing. In this case, according to a rise in an elastic modulus of slurry itself based on the addition of resin particles, a decrease in the number of scratches was confirmed compared with the comparative example 2. However, because the surface itself of the polysilicon film is hydrophobic, a role of surface protection of the polysilicon film could not be expected simply by adding the resin particles. The number of scratches was large.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device for planarizing a silicon oxide film with chemical mechanical polishing using, as a stopper film, a silicon film formed on a semiconductor substrate, wherein
    a surface modification film for hydrophilizing a surface of the silicon film is formed on an upper layer of a polysilicon film,
    a surface of the surface modification film is charged with negative charges, and
    slurry for the chemical mechanical polishing contains cerium oxide particles, a surface active agent, and resin particles having a cationic or anionic functional group.

2. The method of manufacturing a semiconductor device according to claim 1, wherein the surface modification film is formed by oxidation treatment of the upper layer of the silicon film.

3. The method of manufacturing a semiconductor device according to claim 1, wherein the surface modification film is formed by anneal treatment of the upper layer of the silicon film.

4. The method of manufacturing a semiconductor device according to claim 1, wherein the resin particles are polystyrene resin particles or polymethyl methacrylate resin particles.

5. The method of manufacturing a semiconductor device according to claim 1, wherein concentration of the resin particles is within a range of 0.01 percent by mass to 10 percent by mass.

6. The method of manufacturing a semiconductor device according to claim 1, wherein a particle diameter of the resin particles is within a range of 50 angstroms to 10000 angstroms.

7. The method of manufacturing a semiconductor device according to claim 1, wherein the silicon film is used as a gate electrode or a floating gate electrode.

8. The method of manufacturing a semiconductor device according to claim 1, wherein the silicon film is a polysilicon film.

9. The method of manufacturing a semiconductor device according to claim 1, wherein the surface active agent is polyacrylic acid ammonium.

10. The method of manufacturing a semiconductor device according to claim 1, wherein the surface active agent includes $NH_4^+$ as counter ions.

11. The method of manufacturing a semiconductor device according to claim 1, wherein concentration of the surface active agent is within a range of 0.001 percent by mass to 0.3 percent by mass.

12. The method of manufacturing a semiconductor device according to claim 1, wherein the cationic functional group is an amine salt functional group.

13. The method of manufacturing a semiconductor device according to claim 1, wherein the anionic functional group is a carbonic salt functional group or a sulfonic salt functional group.

14. The method of manufacturing a semiconductor device according to claim 1, wherein a flow rate of the slurry is set within a range of 80 ml/min to 400 ml/min.

15. The method of manufacturing a semiconductor device according to claim 1, wherein polishing load of the chemical mechanical polishing is set within a range of 150 hectopascals to 500 hectopascals.

16. The method of manufacturing a semiconductor device according to claim 1, wherein a number of table revolutions and a number of wafer revolutions of the chemical mechanical polishing is set within a range of 60 revolutions per minute to 110 revolutions per minute.

17. A method of manufacturing a semiconductor device comprising:
    forming a first silicon oxide film on a semiconductor substrate;
    forming a polysilicon film on the first silicon oxide film;
    forming a surface modification film for hydrophilizing a surface of the polysilicon film;
    forming device isolation grooves in the semiconductor substrate through the polysilicon film and the first silicon oxide film;
    depositing a second silicon oxide film over an entire surface of the semiconductor substrate to fill the device isolation grooves; and
    planarizing the second silicon oxide film by performing, using the polysilicon film as a stopper film, chemical mechanical polishing of the second silicon oxide film using slurry containing cerium oxide particles, a surface active agent, and resin particles having a cationic or anionic functional group.

18. The method of manufacturing a semiconductor device according to claim 17, wherein the surface modification film is formed by oxidation treatment of an upper layer of the polysilicon film.

19. The method of manufacturing a semiconductor device according to claim 17, wherein the surface modification film is formed by anneal treatment of an upper layer of the polysilicon film.

20. The method of manufacturing a semiconductor device according to claim 17, wherein the resin particles are polystyrene resin particles or polymethyl methacrylate resin particles.

21. A method of manufacturing a semiconductor device for planarizing a silicon oxide film with chemical mechanical polishing using, as a stopper film, a silicon film formed on a semiconductor substrate, wherein
    a polysilicon film is formed on the silicon oxide film;
    a surface modification film for hydrophilizing a surface of the silicon film is formed on an upper layer of the polysilicon film;
    device isolation grooves are formed in the semiconductor substrate through the polysilicon film and the silicon oxide film; and
    slurry for the chemical mechanical polishing contains cerium oxide particles, a surface active agent, and resin particles having a cationic or anionic functional group.

* * * * *